United States Patent
Kitagawa et al.

[19]

[11] Patent Number: 6,166,671
[45] Date of Patent: Dec. 26, 2000

[54] ANALOG-TO-DIGITAL CONVERTING CIRCUIT APPARATUS AND COVERTING METHOD THEREOF

[75] Inventors: Nobutaka Kitagawa, Kawasaki; Yoshikazu Nagashima, Funabashi, both of Japan

[73] Assignee: Kabushiki Kaisha Toshiba, Kawasaki, Japan

[21] Appl. No.: 09/160,541

[22] Filed: Sep. 25, 1998

[30] Foreign Application Priority Data

Sep. 26, 1997 [JP] Japan ................... 9-261756

[51] Int. Cl.[7] .............................. H03M 1/84; H03M 1/88
[52] U.S. Cl. ........................................ 341/139; 341/155
[58] Field of Search .................... 341/161, 155, 341/166, 143, 139

[56] References Cited

U.S. PATENT DOCUMENTS

| | | | |
|---|---|---|---|
| 4,381,496 | 4/1983 | Carter ................................ | 341/155 |
| 4,564,831 | 1/1986 | Wheable et al. .................... | 341/155 |
| 5,105,187 | 4/1992 | Plus et al. ........................... | 340/811 |
| 5,424,936 | 6/1995 | Reddy ................................. | 363/97 |
| 5,488,370 | 1/1996 | Harada ............................... | 341/161 |
| 5,546,044 | 8/1996 | Calligaro et al. ................... | 327/543 |
| 5,760,497 | 6/1998 | Pascucci ............................. | 307/110 |
| 5,812,018 | 9/1998 | Sudo et al. ......................... | 327/537 |
| 5,841,694 | 11/1998 | Wong ................................. | 365/185.05 |
| 5,973,518 | 10/1999 | Vallancourt ........................ | 327/94 |
| 5,991,221 | 11/1999 | Ishikawa ............................ | 365/226 |

FOREIGN PATENT DOCUMENTS

| | | | |
|---|---|---|---|
| 6-85676 | 3/1994 | Japan ......................... | H03M 1/38 |
| 7-74638 | 3/1995 | Japan ......................... | H03M 1/38 |

*Primary Examiner*—Peguy JeanPierre
*Attorney, Agent, or Firm*—Finnegan, Henderson, Farabow, Garrett & Dunner, L.L.P.

[57] ABSTRACT

The analog-to-digital converting circuit apparatus of the invention is intended to realize both low voltage operation and high speed operation of an analog-to-digital converting circuit without impairing the precision characteristic. In plural boosting circuits, voltages higher than each supply voltage are generated. These plural boosting circuits are controlled as the control timing is sequentially shifted by the controller. The boosted voltages delivered from the plural boosting circuits are accumulated in the capacitor, and supplied into the analog-to-digital converter. In the analog-to-digital converter, at the timing other than the changeover timing of the converting action of the analog-to-digital converter, the plural boosting circuits are changed over sequentially, and the boosted voltages are converted from analog to digital values.

4 Claims, 5 Drawing Sheets

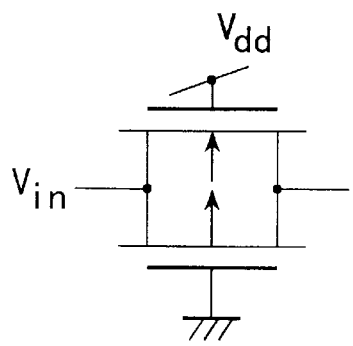
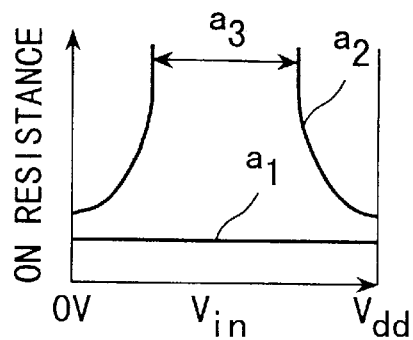
FIG. 1A (PRIOR ART)  FIG. 1B (PRIOR ART)
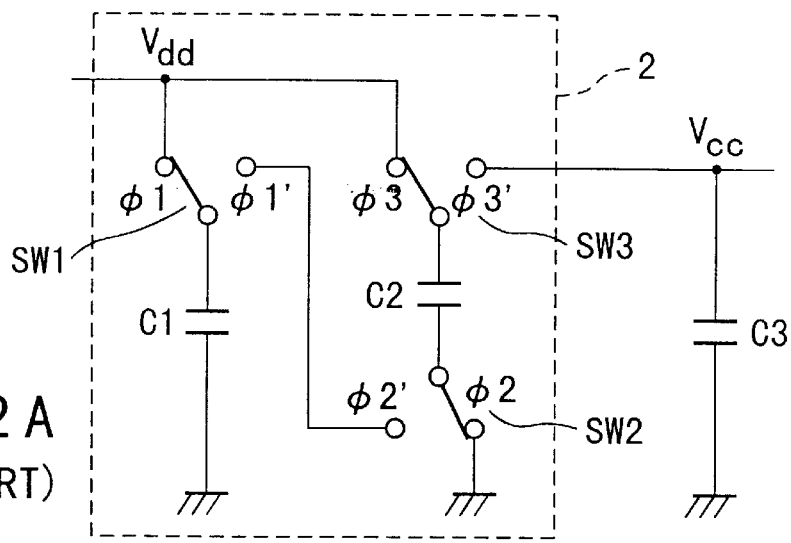
FIG. 2A (PRIOR ART)
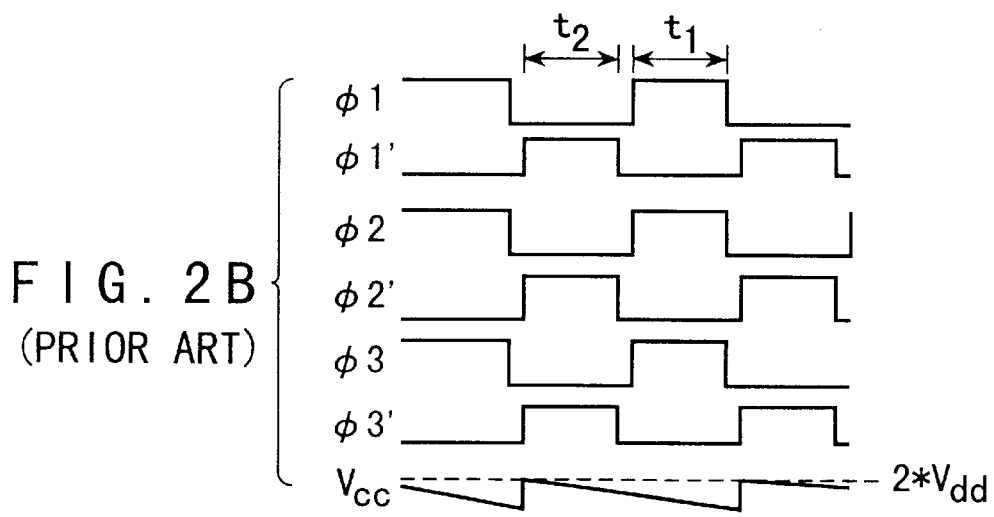
FIG. 2B (PRIOR ART)

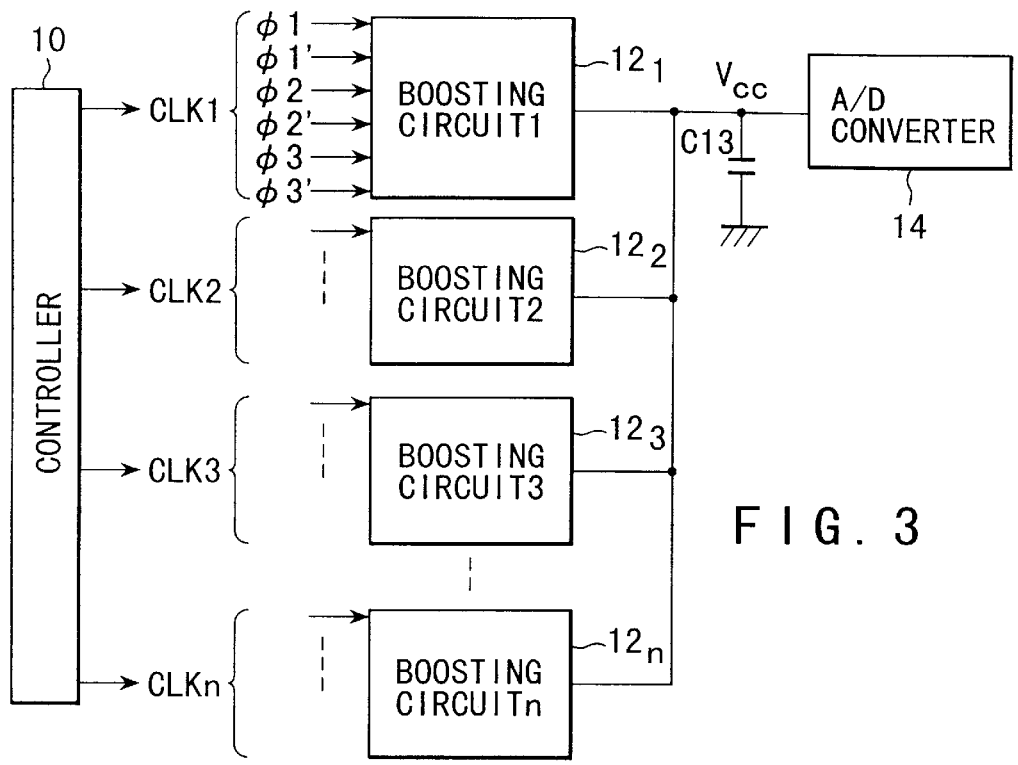
FIG. 3
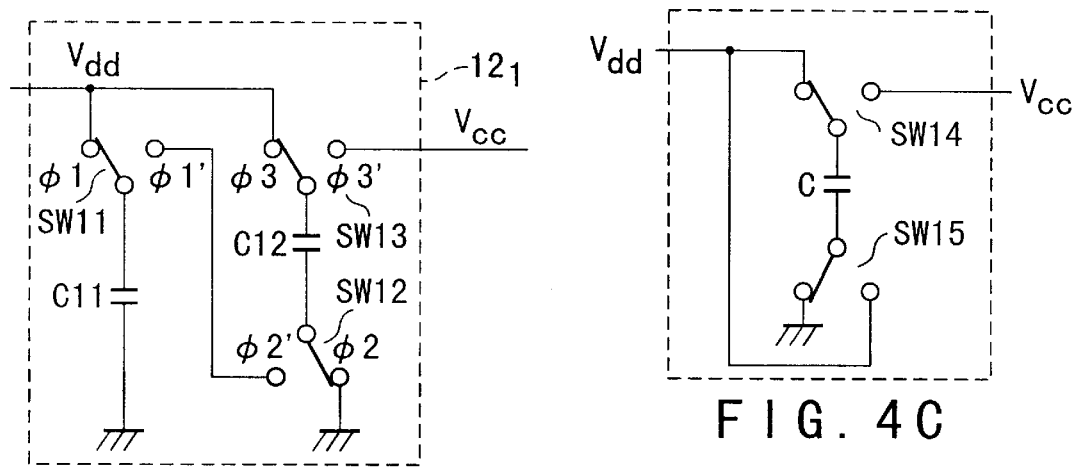
FIG. 4A
FIG. 4C
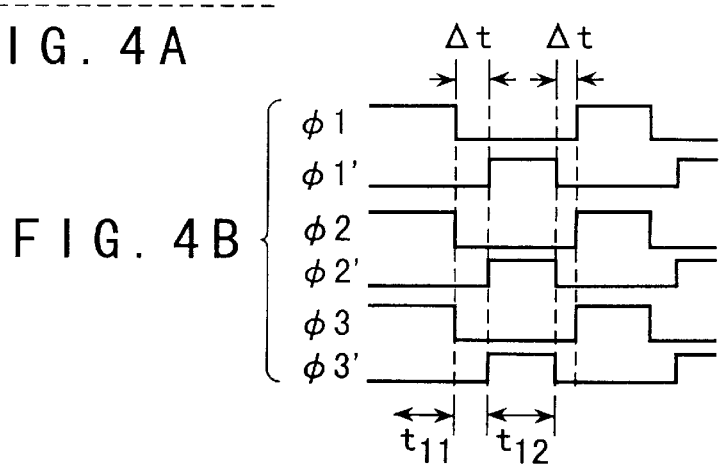
FIG. 4B

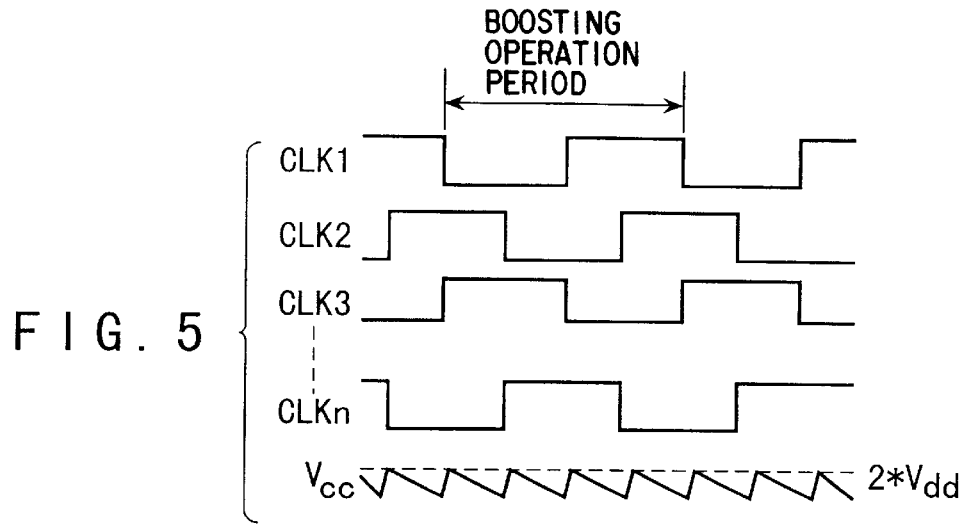
FIG. 5
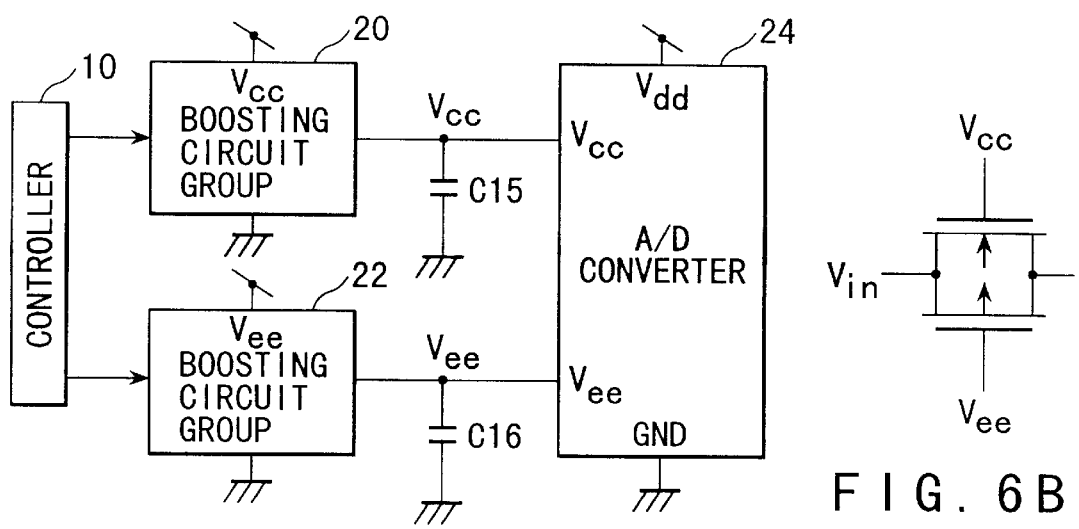
FIG. 6A
FIG. 6B

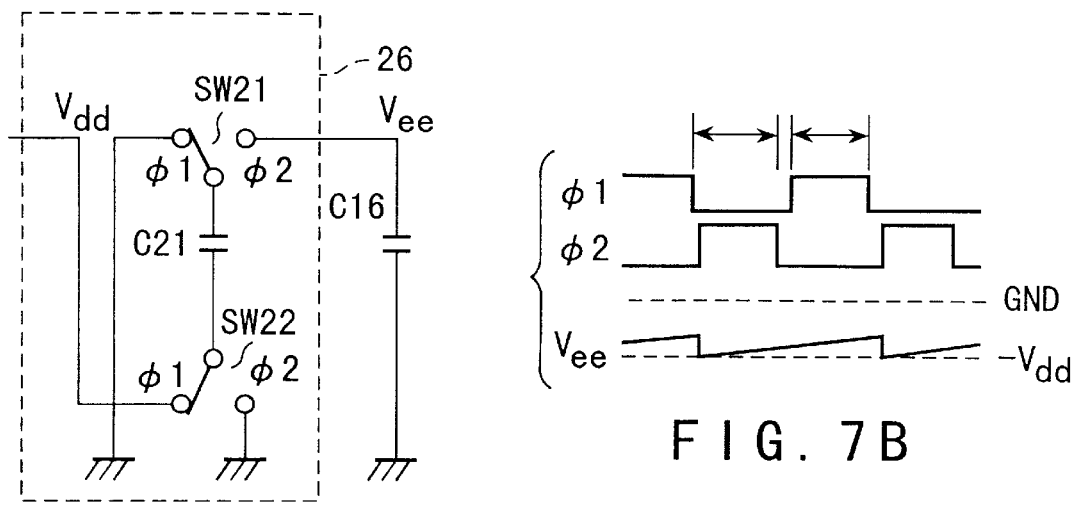
FIG. 7A
FIG. 7B
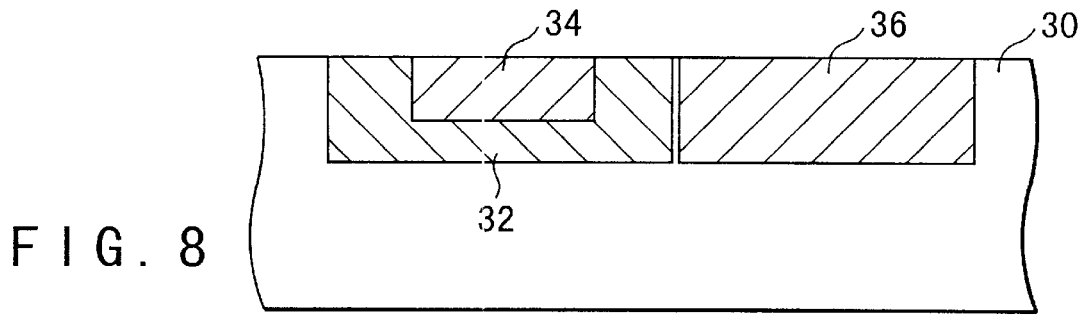
FIG. 8
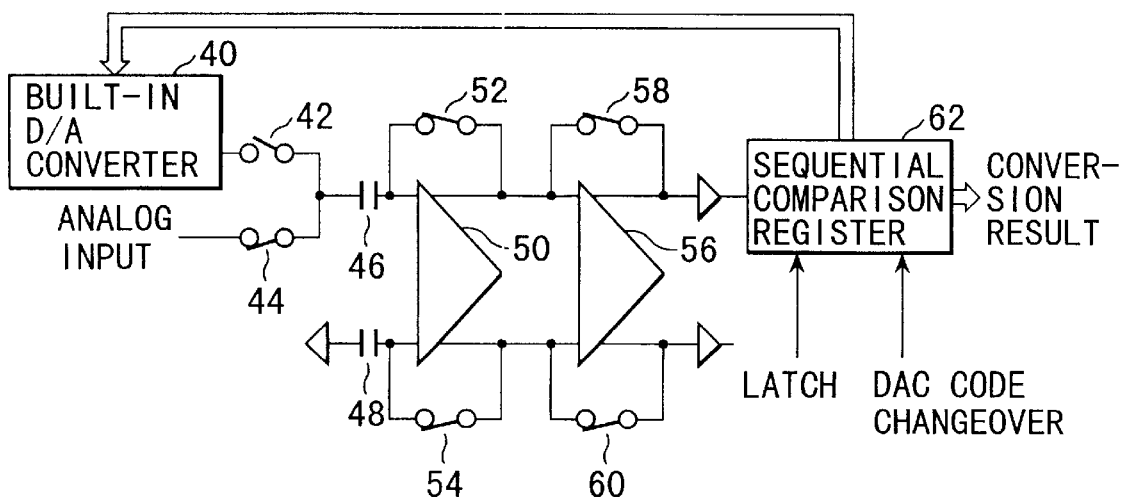
FIG. 9

ANALOG-TO-DIGITAL CONVERTING CIRCUIT APPARATUS AND COVERTING METHOD THEREOF

BACKGROUND OF THE INVENTION

The present invention relates to an analog-to-digital converting apparatus for converting an analog value into a digital value, and more particularly to an analog-to-digital converter required to operate at a low voltage or operate at a high speed.

Recently, semiconductor integrated circuits are used in all fields, and the demand for low power consumption is intensified as being represented by the applications in portable electronic appliances. For low power consumption, in the first place, it is necessary to lower the supply voltage.

In conventional analog circuits including A/D (analog to digital) converters, the analog switch as shown in FIG. 1A is used widely in order to handle an intermediate level voltage within a supply voltage range.

In the case of A/D converters, analog switches are used widely for the role as the switch for charging an input analog value in a sampling capacitor, the role as selector for taking out a comparative voltage from a built-in D/A converter in order to compare the sampled analog value with the reference comparative voltage, etc.

Generally, the analog switch is, in the case of CMOS process, composed by combining P-channel MOSFET and N-channel MOSFET in parallel so as to lower the ON resistance for the input in the supply voltage range.

However, if attempted to operate at a low voltage for lowering power consumption, in analog circuits and A/D converters widely using analog switches, it was very hard to guarantee the low voltage operation. This is because the transistor is not turned on in the relationship between the supply voltage and transistor threshold, transfer voltage.

That is, when the supply voltage is lowered (for example, from the ordinary voltage of 5.0, to 2.7V, 2.2V or the like), owing to the relationship between the MOSFET threshold $V_{th}$ (about 0.8V) and gate voltage Vgs, source voltage $V_{bs}$ (in this case, a voltage to be transferred, ranging from 0 to 2.7V, for example, an intermediate value of 1.35V), considering the N-channel MOS transistor, it follows that $V_{gs}-V_{th}-(V_{th}$ increment by the portion of $V_{th}$ modulation due to $V_{bs}$=about half of $V_{bs}$)

=(2.7−1.35)−0.85−(1.35/2)

=−0.175V and hence this MOS transistor cannot be turned on.

Since the N-channel MOS transistor is not turned on at the intermediate voltage of 1.35V, similarly, the P-channel MOS transistor is not turned on, and the intermediate voltage is not transferred normally (see FIG. 1B). In FIG. 1B, meanwhile, $a_1$ denotes the ON resistance characteristic when boosted, $a_2$ shows the ON resistance characteristic when not boosted, and $a_3$ is the region where the ON resistance is excessive.

If attempted to operate at a high speed, elevation of ON resistance of analog switch causes the prolonging of the charging time to the sampling capacitor or the like. Accordingly, when operated at a high speed, the time necessary for charging is insufficient, and the precision is lowered as a result.

To solve such problems, transistors low in threshold $V_{th}$ may be used in part of the circuit. In this case, however, there is such a drawback that since the process is added, the cost is raised.

FIG. 2A is a diagram showing a general constitution of a boosting circuit, and FIG. 2B is a timing chart for explaining the operation of this circuit.

In FIG. 2A, a boosting circuit 2 is composed of switches SW1, SW2, and SW3, and capacitors C1 and C2. An output capacitor C3 is connected to the output side of the boosting circuit 2.

In the internal operation of the boosting circuit 2, charge period ($t_1$) and charge pump period ($t_2$) are repeated. In the charge period ($t_1$), by changeover of switches SW1, SW2, SW3, corresponding signals Φ1, Φ2, Φ3 are delivered (ON). As a result, the capacitors C1 and C2 are connected parallel, and are individually charged at $V_{dd}$.

On the other hand, in the charge pump period ($t_2$), the switches SW1, SW2, SW3 are changed over, and corresponding signals Φ1', Φ2', Φ3' are delivered. As a result, the two capacitors C1 and C2 are connected in series, and the $V_{dd}$ potential charged in the capacitors C1 and C2 is doubled to be $2*V_{dd}$. Afterwards, a boosting voltage $V_{cc}$ (=$2*V_{dd}$) is generated in the output capacitor C3.

The $V_{dd}$ potential charged in the capacitor C3 declines along with the operation of the A/D converter as its load, and gradually declines from $2*V_{dd}$. Accordingly, by repeating this operation, a boosting potential nearly equal to $2*V_{dd}$ is always obtained.

However, the boosted $V_{cc}$ potential gradually declines as the electric charge is consumed in the process of charging and discharging operation of the circuit operating on the power source of the boosted potential $V_{cc}$ along with the converting action of the A/D converter. The potential lowered cannot be restored to the original level until transition to the next charge pump period.

Therefore, when the boosted potential is lowered more than a certain extent, due to such a fact that noise is superposed on the converting action of the A/D converter in the aspect of precision and operation speed, the A/D converter can be actually operated only for a shorter period than the clock period. In particular, in the case of the A/D converter incorporating a microcomputer it is required to stabilize the boosted voltage for a very long period for realizing various converting actions, such as scan operation for sequentially converting multiple analog input channels, repeat action for repeating conversion of same channel, and scan repeat action for repeating scan operation.

In addition, sudden changes of $V_{cc}$ potential generating at the timing of transition to the charge pump period have direct effects on the precision of the A/D converter, and hence it is not preferred to repeat boosting operation plural times within one conversion cycle.

Accordingly, for stabilization of the boosted potential for such a long period, there is no other effective means than accumulation of a sufficient electric charge in a huge stabilizing capacitor C3, which involves a problem of increase of cost in relation to the capacitor area.

BRIEF SUMMARY OF THE INVENTION

It is hence an object of the invention to provide an analog-to-digital converting circuit apparatus capable of realizing both low voltage operation and high speed operation, without impairing the precision characteristic, and its converting method.

It is another object of the invention to provide an analog-to-digital converting circuit comprising plural boosting circuits for generating voltages higher than the supply voltage or lower than the grounding voltage being controlled as the control timing is sequentially shifted, an analog-to-digital converter circuit for using the boosted voltages produced from the plural boosting circuits at least as a part of the power source, and a controller for controlling the operations of the plural boosting circuits at the timing synchronized with the operation timing of the analog-to-digital converter circuit and at the timing other than the changeover timing of the converting operation of the analog-to-digital converter circuit.

It is also an object of the invention to provide an analog-to-digital converting circuit comprising plural positive polarity boosting circuits for generating voltages higher than the supply voltage being controlled as the control timing is sequentially shifted, plural negative polarity boosting circuits for generating voltages lower than the grounding voltage controlled as the control timing is sequentially shifted, an analog-to-digital converter circuit for using the positive polarity boosted voltages and negative polarity boosted voltages at least as a part of the power source, and a controller for controlling the operations of the plural boosting circuits of the plural positive polarity boosting circuits and negative polarity boosting circuits at the timing synchronized with the operation timing of the analog-to-digital converter circuit, and at the timing other than the changeover timing of the analog-to-digital converter circuit.

It is a further object of the invention to provide a converting method for an analog-to-digital converting circuit apparatus comprising a first step of shifting the boosting operation for generating boosted voltages higher than the supply voltage by repeating charge and charge pump for capacitors of a plurality of boosting circuits, sequentially in every one of the plurality of boosting circuits, a second step of changing over the boosted voltages generated in the first step, in every one of the plurality of boosting circuits, and a third step of supplying the boosted voltages from the plurality of boosting circuits obtained in the second step, into the analog-to-digital converter at least as a part of the power source.

The analog-to-digital converting circuit apparatus of the invention includes a plurality of boosting circuits for producing boosted voltages higher than the supplied power source voltage, and a boosted voltage is always applied to the analog-to-digital converter through a control circuit for connecting the individual boosting circuits sequentially to the analog-to-digital converter. Accordingly, low voltage operation is realized also during analog-to-digital converting time of a long cycle of scan or repeat.

By supplying boosted voltages to analog switches and others in the analog-to-digital converting circuit, the ON resistance can be lowered, and the operation frequency can be raised if the supply voltage is constant, or when the operation frequency is constant, the operation is possible at lower voltage. Moreover, both low voltage operation and high speed operation are realized.

In the individual boosting circuits, further, by synchronizing the timing of charge operation, charge pump operation, output connection operation, and others with the control timing of the analog-to-digital converting circuit, and avoiding the timing sensitive to noise, the precision performance will not be impaired.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a diagram showing an arrangement of a general analog switch, and FIG. 1B is a diagram showing a characteristic example of the switch in FIG. 1A;

FIG. 2A is a diagram showing a constitution of a general boosting circuit, and FIG. 2B is a timing chart for explaining the circuit operation in FIG. 2A;

FIG. 3 explains a first embodiment of the invention, showing a schematic constitution of an analog-to-digital converting circuit;

FIG. 4A is a diagram showing an example of constitution of boosting circuits $12_1$, $12_2$, $12_3$, ..., $12_n$ in FIG. 3, FIG. 4B is a timing chart for explaining the operation of the boosting circuit 121 in FIG. 4A, and FIG. 4C is a diagram showing other example of constitution of boosting circuit;

FIG. 5 is a timing chart for explaining the operation of the analog-to-digital converting circuit in FIG. 3;

FIG. 6A explains a second embodiment of the invention, showing a schematic arrangement of an analog-to-digital converting circuit apparatus, and FIG. 6B shows an example of constitution of analog switch in the second embodiment of the invention;

FIG. 7A is a circuit diagram showing an example of constitution of a minus boosting voltage for composing a minus side $V_{cc}$ boosting circuit group 22 in FIG. 6A, and FIG. 7B is a timing chart for explaining the operation of the minus boosting circuit 26 in FIG. 7A;

FIG. 8 is a sectional view showing an example of semiconductor integrated circuit used in the minus boosting circuit 26;

FIG. 9 explains a third embodiment of the invention, showing a constitution of a representative sequential comparison type A/D converter.

DETAILED DESCRIPTION OF THE INVENTION

Figure 10:
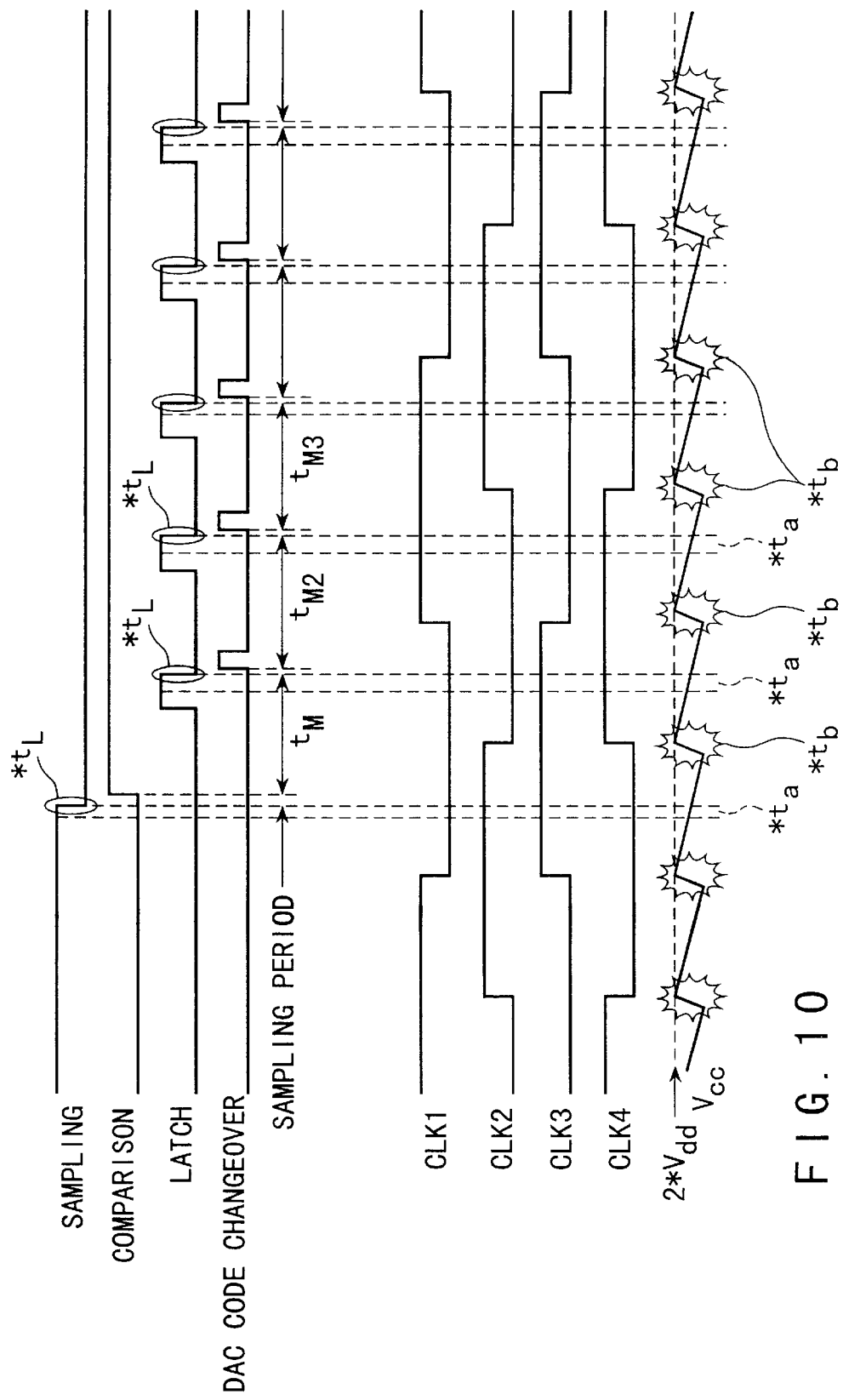
FIG. 10 is a timing chart for explaining the control timing of the sequential comparison type A/D converter in FIG. 9.

Referring now to the drawings, preferred embodiments of the invention are specifically described below.

FIG. 3 explains a first embodiment of the invention, showing a schematic constitution of an analog-to-digital converting circuit.

In FIG. 3, this analog-to-digital converting circuit apparatus includes a controller 10, and a plurality of boosting circuits for receiving clock signals CLK composed of mutually contradictory signals Φ1 and Φ1', Φ2 and Φ2', and Φ3 and Φ3', which are produced from this controller 10. That is, clock signals CLK1, CLK2, CLK3, ..., CLK$_n$ are entered into boosting circuits $12_1$, $12_2$, $12_3$, ..., $12_n$, respectively.

The outputs of the boosting circuits $12_1$, $12_2$, $12_3$, ..., $12_n$ are supplied into a capacitor 13 connected between the power source wire at $V_{cc}$ potential and the ground, and are also supplied into an A/D (analog-to-digital) converter 14.

FIG. 4 shows an example of constitution of the boosting circuits $12_1$, $12_2$, $12_3$, ..., $12_n$, in which the boosting circuit 12a is representatively shown, and the constitution of the other boosting circuits $12_2$, $12_3$, ..., $12_n$ is also the same and their description is omitted herein.

The boosting circuit $12_1$ is composed of switches SW11, SW12, and SW13, and capacitors C11 and C12. The capacitors C11 and C12 are either connected parallel between the power source wire and ground, or connected in series, by changeover of the switches SW11, SW12, SW13.

As shown in FIG. 4B, the boosting circuit $12_1$ repeats the internal operation between the charge period ($t_{11}$) and charge pump period ($t_{12}$). In the charge period ($t_{11}$), signals Φ1, Φ2, Φ3 are delivered (turned on), and the capacitors C11, C12 are connected parallel, and are individually charged at $V_{dd}$.

On the other hand, in the charge pump period ($t_{12}$), the switches SW11, SW12, SW13 are changed over, and signals Φ1', Φ2', Φ3' are delivered, respectively. As a result, the two capacitors C11, C12 are connected in series, and the potential $2*V_{dd}$ is two times as much as the potential $V_{dd}$ charged in the capacitors C11 and C12.

Afterwards, a boosted potential $V_{cc}$ (=$2*V_{dd}$) is generated in the capacitor C13.

As the boosting circuit, the one as shown in FIG. 4C may be also used.

In the invention, preparing a plurality of boosting circuits, it is intended to obtain a stabilized boosted voltage on the whole by changing over each charge period and charge pump period while shifting sequentially.

That is, in the case of the first embodiment, the boosting circuits operate sequentially, as shown in FIG. 5, by shifting by the time corresponding to 1/n of the boosting operation period (clock signals CLK1, CLK2, . . . ). Hence, the equivalent boosting period can be shortened to 1/n of the number of boosting circuits. Accordingly, the frequency of occurrence of noise when transferring to each charge pump period increases by n times, but it is controlled to change over the boosting circuits in the period of low sensitivity to noise during conversion action of the A/D converter 14. Thus, without giving effects on the precision of the A/D converter 14, high speed and low voltage operation is enabled.

During the conversion action of the A/D converter 14, the timing susceptible to effects of noise includes the end timing of the period for storing the input analog value in the internal sampling capacitor, and the end timing of the comparison period of each bit. Therefore, since the timing is preliminarily known in the design stage, it is possible to avoid, as shown in FIG. 5, by shifting the changeover timing to the charge pump period.

Thus, by adjusting the timing with the plurality of boosting circuits, also in the long conversion period necessary for scan or repeat, the boosted voltage can be stably supplied into the A/D converter.

A second embodiment of the invention is described below.

FIGS. 6A and 6B relate to a second embodiment of the invention, showing a schematic constitution of an analog-to-digital converting circuit apparatus.

In the foregoing embodiment 1, from the potential of more than the supply voltage $V_{dd}$, for example, a double $V_{cc}$ potential is obtained. In this second embodiment, by obtaining a minus potential $V_{ee}$ by boosting also to less than the grounding potential GND, further low voltage and high speed is realized.

In FIG. 6A, a $V_{cc}$ boosting circuit group 22 is composed of a plurality of plus side boosting circuits, and a $V_{ee}$ boosting circuit group 22 is composed of a plurality of minus side boosting circuits. The outputs of the $V_{cc}$ boosting circuit group 20 and $V_{ee}$ boosting circuit group 22 are supplied to $V_{cc}$ terminal and $V_{ee}$ terminal of an A/D converter 24, respectively, through a capacitor C15 connected between the $V_{cc}$ potential power source wire and the ground, and a capacitor C16 connected between the $V_{ee}$ potential power source wire and the ground. The $V_{cc}$ boosting circuit group 20 and $V_{ee}$ boosting circuit group 22 are operated and controlled by a controller 10.

FIG. 7A is a circuit diagram showing an example of a constitution of a minus boosting circuit 26 for composing the minus side $V_{ee}$ boosting circuit group 22.

This minus boosting circuit 26 is composed of switches SW21, SW22 for delivering (turning on) by changing over two signals Φ1, Φ2, and a capacitor C21.

This minus boosting circuit 26 can easily generate a minus potential $V_{ee}$ by directly inverting the polarity of the charge charged at the supply voltage. The operation timing of the minus boosting circuit 26 is as shown in the timing chart in FIG. 7B.

In the minus boosting circuit 26, in order that a forward current of diode may not flow in the integrated circuit device if the potential is minus, as shown in FIG. 8, a separated (floating) P-type low concentration diffusion layer (P-well) 34 is needed in an N-type low concentration diffusion layer (N-well) 32. However, in particular, in the process of EEPROM or the like, since such low concentration diffusion layer is used preliminarily, a minus potential can be generated by using this diffusion layer. Incidentally, reference numeral 30 is a P-type substrate and 36 is a P-type low concentration diffusion layer (P-well).

In such constitution, $V_{cc}$ potential boosted double (for example, 5.4V) from the supply voltage $V_{dd}$ (for example, 2.7V) is supplied from the $V_{cc}$ boosting circuit group 20, and a potential boosted to minus side (for example, -2.7V) from the $V_{ee}$ boosting circuit group 22, both into the A/D converter 24. At this time, in low voltage operation or high speed operation, in the analog switch having a large effect on ON resistance, a potential as in the analog switch shown in FIG. 6B in ON state can be supplied. Accordingly, the analog input in the supply voltage range (0 to 2.7V) and the analog switch for passing the built-in D/A converter may realize a sufficiently low ON resistance.

A third embodiment of the invention is described below.

This third embodiment relates to a specific example of avoiding timing of large noise.

FIG. 9 is a diagram showing a constitution of a representative sequential comparison type A/D converter, and FIG. 10 is a timing chart for explaining the control timing of the converter.

In FIG. 9, a built-in D/A converter 40 and analog input are supplied into a sampling capacitor 46 through comparison switch (SW) 42 and sampling switch 44. The output of the sampling capacitor 46 is supplied to the input end of a comparator 50 together with the output of a sampling capacitor 48. The input and output ends of the comparator 50 are fed back through sampling switches 52, 54.

The output of the comparator 50 is supplied into the input end of a comparator 56. The input and output ends of the comparator 56 are also fed back through sampling switches 58, 60. The output of the comparator 56 is supplied into a sequential comparison register 62. From this sequential comparison register 62, the conversion output is issued, and a code is sent out into the built-in D/A converter 40.

Referring next to the timing chart in FIG. 10, the operation of the third embodiment is described below.

The sequential comparison type A/D converter sets the comparator at the action point in the sampling period, accumulates the analog input in the sampling capacitor, changes over the input of the sampling capacity into the built-in D/A converter, and determines the result of conversion by comparing sequentially from the MSB (most significant bit). In FIG. 10, $t_{M1}$, $t_{M2}$, $t_{M3}$ respectively denote the first, second and third time of MSB comparison period.

In the last comparison period, latching of comparator output is terminated, and the content of the sequential comparison register 62 is rewritten depending on the result of comparison. In order to obtain the reference potential necessary for next bit conversion, the code is sent from the sequential comparison bit 62 to the built-in D/A converter 40.

In FIG. 10, the portion indicated by $*t_L$ in the diagram expresses the timing of sampling end and latch end. If noise is mixed in the period $*t_a$ immediately before including this timing, for example, the sampled charge may be varied, or the comparator output may be varied immediately before latch, which may directly lead to lowering of precision. This noise effect susceptible period $*t_a$ varies with various factors, such as the level of noise, degree of mixing, the time constant until the effect is restored if noise effect is caused by capacitor coupling, and difference between sampling voltage at the bit and the D/A converter voltage. However, by investigating in all analog input range, the noise effect susceptible period $*t_a$ may be determined.

Boosting operation during this period, in particular, the transfer timing to the charge pump must be avoided because noise may be directly mixed into the analog switch. However, since this period is known, the transfer timing to the charge pump period in the invention can be avoided.

FIG. 10 shows an example of operating sequentially four charge pump circuits, and from the sampling capacitors 46, 48, charge pump is effected sequentially in each bit comparison period. After the falling edge of D/A converter changeover, and before the noise effect susceptible period $*t_a$, in this case in the period not influenced by noise $*t_b$, it is controlled to effect charge pump. As a result, without any effect on the precision, a stable boosted voltage can be supplied into the A/D converter in synchronism with the operation of the A/D converter.

Modified methods are possible, of course, including a method of deviating the timing and a method of effecting charge pump over conversion periods of plural bits, and the individual values may be determined, needless to say, appropriately in relation to the driving frequency of charge pump, load current in the boosting operation voltage supply unit of A/D converter, and capacity of capacitor for composing the charge pump.

Thus, in the invention, by preparing a plurality of boosting circuits, a stable boosted voltage can be obtained on the whole by changing over the individual charge period and charge pump period while shifting sequentially.

According to the invention, therefore, without impairing the precision characteristic, the analog-to-digital converting circuit apparatus realizing low voltage operation or high speed operation and its converting method can be presented. In particular, since transistors of low threshold are not used, the cost is lower than the constitution using them, and it is possible to constitute in an ordinary CMOS process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An analog-to-digital converting circuit apparatus comprising:
    plural positive polarity boosting circuits for generating voltages higher than a supply voltage being controlled by shifting sequentially a control timing signal,
    plural negative polarity boosting circuit for generating voltages lower than a grounding voltage being control by shifting sequentially a control timing signal,
    an analog-to-digital converter circuit for using said positive polarity boosted voltages and negative polarity boosted voltages at least as a part of a power source, and
    a controller for controlling the operation of the boosting circuits and negative polarity boosting circuits at a timing synchronized with an operation timing of said analog-to-digital converter circuit, and at a timing other than a changeover timing of said analog-to-digital converter circuit.

2. A converting method of an analog-to-digital converting circuit apparatus comprising:
    a first step of shifting a boosting operation for generating boosted voltages higher than a supply voltage by repeating charge and charge pump of capacitor of boosting circuits, sequentially in every one of a plurality of boosting circuits,
    a second step of changing over the boosted voltages generated in said first step, in every one of said plurality of boosting circuits, and
    a third step of supplying the boosted voltages from said plurality of boosting circuits obtained in said second step, into the analog-to-digital converter at least as a part of a power source.

3. An analog-to-digital converting circuit apparatus comprising:
    plural boosting circuits for generating voltages higher than a supply voltage or lower than a grounding voltage being control by shifting sequentially a control timing signal,
    an analog-to-digital converter circuit for using boosted voltages produced from said plural boosting circuits at least as a part of a power source, said analog-to-digital converter circuit comprising:
        a built-in digital-to-analog converter;
        changeover means for changing over an output from said built-in digital-to-analog converter and an analog input,
        a sampling capacitor for accumulating changeover outputs from said changeover means,
        a comparator for comparing the changeover outputs accumulated in said sampling capacitor, and
        a sequential comparison register for rewriting a content of the register depending on the result of comparison by said comparator,
        a controller for controlling the operation of said boosting circuits at a timing synchronized with an operation timing of said analog-to-digital converter circuit, and at a timing other than a changeover timing of a converting operation of said analog-to-digital converter circuit; and wherein:
    said changeover means change over so that the output of said built-in digital-to-analog converter may be accumulated in said sampling capacitor after said analog input is stored in said sampling capacitor, and
    said sequential comparison register rewrites the content according to the comparison result in the last comparison period depending on the comparison result of said comparator, and issues the information of reference potential necessary for conversion of next bit to said built-in digital-to-analog circuit.

4. An analog-to-digital converting circuit apparatus comprising:

plural boosting circuits for generating voltages higher than a supply voltage or lower than a grounding voltage being control by shifting sequentially a control timing signal, said plural boosting circuits including:

first and second capacitors; and switching means for connecting said first and second capacitors in parallel between a power source wire and the ground in a charge period, and connecting said first and second capacitors in series between said power source wire and ground in a charge pump period;

an analog-to-digital converter circuit for using the boosted voltages produced from said plural boosting circuits at least as a part of a power source, and a controller for controlling the operation of said boosting circuits at a timing synchronized with an operation timing of said analog-to digital converter circuit, and at a changeover timing of a converting operation of said analog-to-digital converter circuit.

* * * * *

UNITED STATES PATENT AND TRADEMARK OFFICE
CERTIFICATE OF CORRECTION

PATENT NO. : 6,166,671
DATED : December 26, 2000
INVENTOR(S) : Nobutaka Kitagawa et al.

It is certified that error appears in the above-identified patent and that said Letters Patent is hereby corrected as shown below:

Title page,
Item [54], in the title, "COVERTING" should read -- CONVERTING --.

Column 8,
Line 8, "being control" should read -- being controlled --.
Line 14, before "boosting", insert -- positive polarity --.
Line 39, "being control" should read -- being controlled --.

Column 9,
Line 9, "being control" should read -- being controlled --.

Signed and Sealed this

Twenty-fifth Day of June, 2002

Attest:

JAMES E. ROGAN
Attesting Officer          Director of the United States Patent and Trademark Office